US010793773B2

United States Patent
Du et al.

(10) Patent No.: US 10,793,773 B2
(45) Date of Patent: Oct. 6, 2020

(54) COLOR STABLE RED-EMITTING PHOSPHORS

(71) Applicant: Current Lighting Solutions, LLC, East Cleveland, OH (US)

(72) Inventors: Fangming Du, Northfield, OH (US); James Edward Murphy, Niskayuna, NY (US); Srinivas Prasad Sista, Niskayuna, NY (US); Clark David Nelson, Concord Township, OH (US); Jenna Marie Baldesare, East Cleveland, OH (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 348 days.

(21) Appl. No.: 15/709,557

(22) Filed: Sep. 20, 2017

(65) Prior Publication Data

US 2018/0265778 A1 Sep. 20, 2018

Related U.S. Application Data

(60) Provisional application No. 62/472,135, filed on Mar. 16, 2017.

(51) Int. Cl.
*C09K 11/61* (2006.01)
*H01L 33/50* (2010.01)
*H01L 33/48* (2010.01)
*C09K 11/57* (2006.01)

(52) U.S. Cl.
CPC ............ *C09K 11/616* (2013.01); *C09K 11/57* (2013.01); *H01L 33/502* (2013.01); *H01L 33/486* (2013.01); *H01L 33/508* (2013.01); *H01L 2933/0041* (2013.01)

(58) Field of Classification Search
CPC .............................. C09K 11/616; C09K 11/57
See application file for complete search history.

(56) References Cited

U.S. PATENT DOCUMENTS

| | | | |
|---|---|---|---|
| 7,358,542 | B2 | 4/2008 | Radkov et al. |
| 7,497,973 | B2 | 3/2009 | Radkov et al. |
| 7,648,649 | B2 | 1/2010 | Radkov et al. |
| 8,252,613 | B1 | 8/2012 | Lyons et al. |
| 8,491,816 | B2 | 7/2013 | Hong et al. |
| 8,906,724 | B2 | 12/2014 | Murphy et al. |
| 9,982,190 | B2 * | 5/2018 | Murphy ............... C09K 11/616 |
| 10,047,286 | B2 * | 8/2018 | Du ....................... C09K 11/617 |
| 2015/0054400 | A1 | 2/2015 | Murphy |
| 2015/0329770 | A1 | 11/2015 | Kaneyoshi et al. |
| 2016/0024378 | A1 | 1/2016 | Murphy |
| 2016/0115382 | A1 | 4/2016 | Du et al. |
| 2016/0244663 | A1 | 8/2016 | Murphy et al. |
| 2018/0053881 | A1 | 2/2018 | Murphy et al. |

FOREIGN PATENT DOCUMENTS

KR 10-2015-0126298 A 11/2015

OTHER PUBLICATIONS

Paulusz, A.G., "Efficient Mn(IV) Emission in Fluorine Coordination," Journal of Electrochemical Society, pp. 942-947 (1973) (Abstract).
Murphy, J.E., Flow synthesis of pfs, GE co-pending U.S. Appl. No. 62/118,703, filed Feb. 20, 2015.
Du, F., et al., Semi-continuous process to synthesize narrow red emitting LED phosphor, GE co-pending U.S. Appl. No. 62/169,192, filed Jun. 1, 2015.
Nguyen, H.D. and Liu, R.S., "Narrow-band red-emitting Mn 4+-doped hexafluoride phosphors: synthesis, optoelectronic properties, and applications in white light-emitting diodes," Journal of Materials Chemistry C., Issue. 46, vol. 4(2016)(Abstract).
Wei, L.L., "A low-temperature co-precipitation approach to synthesize fluoride phosphors K2MF6:Mn4+ (M = Ge, Si) for white LED applications," Journal of Materials Chemistry C., Issue. 8, vol. 3(2015).
International Search Report and Written Opinion issued in connection with corresponding PCT Application No. PCT/US2018/016360 dated Jun. 15, 2018.

* cited by examiner

*Primary Examiner* — C Melissa Koslow
(74) *Attorney, Agent, or Firm* — Buckley, Maschoff & Talwalkar LLC

(57) ABSTRACT

A process for preparing a $Mn^{+4}$ doped phosphor of formula I $$A_x[MF_y]: Mn^{+4} \qquad \text{I}$$

includes gradually adding a first solution comprising a source of M and HF and a second solution comprising a source of Mn to a reactor, in the presence of a source of A and an anion selected from phosphate, sulfate, acetate, and combinations thereof, to form a product liquor comprising the $Mn^{+4}$ doped phosphor. The process also includes gradually discharging the product liquor from the reactor while volume of the product liquor in the reactor remains constant. A is Li, Na, K, Rb, Cs, or a combination thereof; M is Si, Ge, Sn, Ti, Zr, Al, Ga, In, Sc, Y, La, Nb, Ta, Bi, Gd, or a combination thereof; x is the absolute value of the charge of the $[MF_y]$ ion; and y is 5, 6 or 7.

18 Claims, 3 Drawing Sheets

COLOR STABLE RED-EMITTING PHOSPHORS

CROSS-REFERENCE TO RELATED APPLICATIONS

This application claims priority to prior-filed, commonly owned, copending U.S. Provisional Application 62/472,135, filed 16 Mar. 2017, which is herein incorporated by reference.

BACKGROUND

Red-emitting phosphors based on complex fluoride materials activated by $Mn^{4+}$, such as those described in U.S. Pat. No. 7,358,542, U.S. Pat. No. 7,497,973, and U.S. Pat. No. 7,648,649, can be utilized in combination with yellow/green emitting phosphors such as YAG:Ce to achieve warm white light (CCT<5000 K on the blackbody locus, color rendering index (CRI)>80) from a blue LED, equivalent to that produced by current fluorescent, incandescent and halogen lamps. These materials absorb blue light strongly and efficiently emit in a range between about 610 nm and 658 nm with little deep red/NIR emission. Therefore, luminous efficacy is maximized compared to red phosphors that have significant emission in the deeper red where eye sensitivity is poor. Quantum efficiency (QE) can exceed 85% under blue (440-460 nm) excitation. In addition, use of the red phosphors for displays can yield high gamut and efficiency.

Processes for preparing the materials described in the patent and scientific literature typically involve mixing the raw materials and precipitating the product. Some examples of such batch processes are described in Paulusz, A. G., J. Electrochem. Soc., 942-947 (1973), U.S. Pat. No. 7,497,973, and U.S. Pat. No. 8,491,816. However, scale-up issues and batch to batch variation of properties of the product can be a problem. Moreover, batch processes can produce materials having a broad range of particles sizes including relatively large particles. Large particles may clog dispensing equipment, causing problems in manufacturing LED packages, and also tend to settle unevenly, resulting in a non-homogeneous distribution. Therefore, processes for preparing the red phosphor that can allow better control over the final properties of the product while maintaining performance in lighting and display applications, are desirable.

BRIEF DESCRIPTION

In one example, the inventive subject matter disclosed herein provides a process for preparing a $Mn^{+4}$ doped phosphor of formula I

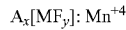

$$A_x[MF_y]:Mn^{+4} \quad \text{I}$$

where the process includes gradually adding a first solution comprising a source of M and HF and a second solution comprising a source of Mn to a reactor, in the presence of a source of A and an anion selected from phosphate, sulfate, acetate, and combinations thereof, to form a product liquor comprising the $Mn^{+4}$ doped phosphor. The process also includes gradually discharging the product liquor from the reactor while volume of the product liquor in the reactor remains constant. A is Li, Na, K, Rb, Cs, or a combination thereof; M is Si, Ge, Sn, Ti, Zr, Al, Ga, In, Sc, Y, La, Nb, Ta, Bi, Gd, or a combination thereof; x is the absolute value of the charge of the $[MF_y]$ ion; and y is 5, 6 or 7.

The inventive subject matter described herein also provides a $Mn^{+4}$ doped phosphor of formula I prepared by this process, as well as a lighting apparatus and a backlight device that includes this $Mn^{+4}$ doped phosphor.

In another example, the inventive subject matter described herein provides a process for preparing a $Mn+^4$ doped phosphor of formula I, where the process includes gradually adding a first solution comprising a source of M and HF and a second solution comprising a source of Mn to a reactor, in the presence of a source of A and a source of an anion selected from phosphate, sulfate, acetate, and combinations thereof, to form a product liquor comprising the $Mn^{+4}$ doped phosphor, wherein the source of the anion is an acid, a salt, or a combination thereof. The process also includes gradually discharging the product liquor from the reactor while volume of the product liquor in the reactor remains constant. A is Li, Na, K, Rb, Cs, or a combination thereof; M is Si, Ge, Sn, Ti, Zr, Al, Ga, In, Sc, Y, La, Nb, Ta, Bi, Gd, or a combination thereof x is the absolute value of the charge of the $[MF_y]$ ion; and y is 5, 6 or 7.

A $Mn^{+4}$ doped phosphor of formula I prepared by this process, as well as a lighting apparatus and a backlight device that includes the Mn' doped phosphor also are described herein.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
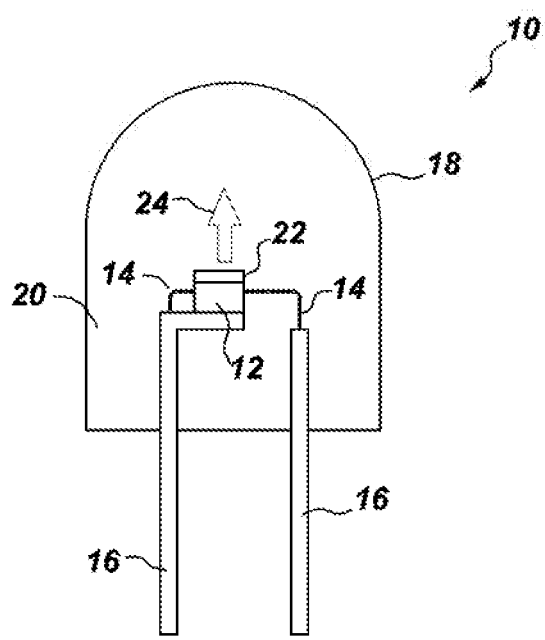
FIG. 1 is a schematic cross-sectional view of a lighting apparatus in accordance with one embodiment of the invention.

The $Mn^{4+}$ doped phosphors described herein are complex fluoride materials, or coordination compounds, containing at least one coordination center, surrounded by fluoride ions acting as ligands, and charge-compensated by counter ions as necessary. For example, $K_2SiF_6:Mn^{4+}$, the coordination center is Si and the counterion is K. Complex fluorides are occasionally written as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting for part of the centers of the host lattice, for example, Si. The host lattice (including the counter ions) may further modify the excitation and emission properties of the activator ion.

In particular embodiments, the coordination center of the phosphor, that is, M in formula I, is Si, Ge, Sn, Ti, Zr, or a combination thereof. More particularly, the coordination center is Si, Ge, Ti, or a combination thereof, and the counterion, or A in formula I, is Na, K, Rb, Cs, or a combination thereof, and y is 6. Examples of phosphors of formula I include Examples of phosphors of formula I include $K_2[SiF_6]:Mn^{4+}$, $K_2[TiF_6]:Mn^{4+}$, $K_2[SnF_6]:Mn^{4+}$, $Cs_2[TiF_6]$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular embodiments, the phosphor of formula I is $K_2SiF_6:Mn^{4+}$.

The amount of manganese in the $Mn^{4+}$ doped phosphors of formula I may range from about 1.2 mol % (about 0.3 wt %) to about 16.5 mol % (about 4 wt %). In particular embodiments, the amount of manganese may range from about 2 mol % (about 0.5 wt %) to 13.4 mol % (about 3.3 wt %), or from about 2 mol % to 12.2 mol % (about 3 wt %), or from about 2 mol % to 11.2 mol % (about 2.76 wt %), or from about 2 mol % to about 10 mol % (about 2.5 wt %), or from about 2 mol % to 5.5 mol % (about 1.4 wt %), or from about 2 mol % to about 3.0 mol % (about 0.75 wt %).

A process according to the present invention includes gradually adding a first solution that contains aqueous HF and a source of M and a second solution that contains a source of Mn to a reactor in the presence of a source of A to form a product liquor comprising the $Mn^{4+}$ doped phosphor of formula I, and periodically discharging the product liquor from the reactor. Feed solutions include at least the first and second solutions, along with other solutions that may be added to the reactor before or during the discharging. A process according to the present invention includes gradually adding a first solution that contains aqueous HF and a source of M and a second solution that contains a source of Mn to a reactor in the presence of a source of A while gradually discharging the product liquor from the reactor. Discharging of at least a portion of the product liquor occurs contemporaneously with addition of the first and second solution. Volume of the product liquor in the reactor is maintained at an equilibrium level by discharging the product liquor at about the same rate that feed solutions are added to the reactor. Feed solutions include at least the first and second solutions, along with other solutions that may be added to the reactor before or during the discharging.

Optionally, the process may include gradually adding a first solution that contains aqueous HF and a source of M and a second solution that contains a source of Mn to a reactor in the presence of a source of A. Volume of the product liquor in the reactor is maintained at an equilibrium level by discharging the product liquor at about the same rate that feed solutions are added to the reactor. Feed solutions include at least the first and second solutions, along with other solutions that may be added to the reactor before or during the discharging. In some embodiments, the feed solutions may be added to the reactor during an initial period when the reactor is filled to an equilibrium volume without discharging the product liquor. The equilibrium volume is the volume that remains substantially constant while the product liquor is discharged, and is approximately equal to the amount of feed solutions that are added to the reactor in five minutes, particularly in three minutes, more particularly in two minutes, and even more particularly in one minute. The equilibrium volume may be less than 35% of the total volume of all feed solutions, particularly less than 25% of the total volume of all feed solutions, and more particularly less than 15% of the total volume of all feed solutions. In embodiments where the total amount of feed solution is about 1000 mL, the equilibrium volume may range from about 70-200 mL, particularly from about 100-150 mL. Volume of the product liquor remains constant from the time that discharging of the product liquor begins until the discharging is discontinued, or until addition of all feeds is complete or otherwise discontinued. After discharging has begun, the rate of discharge is approximately the same as the total rate of addition of all feeds into the reactor so that the volume of the product liquor remains approximately constant during the discharge period. In the context of the present invention, 'remains approximately constant' means that the volume of the product liquor varies less than about 50% over the time period when the product liquor is being discharged, particularly about 20%, and more particularly about 10%. The reaction time, that is, the length of the addition and discharge periods, is not critical. In some embodiments, it may range from about one hour to about two hours. In some embodiments, the feed rates may be set to produce about 10 g product per minute. The feed rate, discharge rate, and equilibrium volume may be chosen so that residence time of the product phosphor in the reactor ranges from about 5 seconds to about 10 minutes, particularly from about 30 seconds to about 5 minutes, more particularly about 30 seconds to about 2 minutes, even more particularly about one minute.

In one or more embodiments, the process includes gradually adding the first solution that contains aqueous HF and the source of M and the second solution that contains the source of Mn to the reactor in the presence of the source of A and an anion selected from phosphate, sulfate, acetate, and combinations thereof, to form a product liquor comprising the Mil' doped phosphor of formula I, and periodically discharging the product liquor from the reactor. The first solution and the second solution can be added to the reactor in the presence of the source of A and the anion and, optionally, a cation selected from H, Li, Na, K, Rb, Cs, or a combination thereof. The first and/or second solution can include the $H^+$ and $A^+$ cations. The anion and/or cation may be obtained from an acid, such as sulfuric acid, phosphoric acid, hydrochloric acid, nitric acid, hydrobromic acid, hydriodic acid, or perchloric acid; or from potassium sulfate, a potassium acetate, or another potassium source.

Gradually adding the first solution and the second solution to the reactor can include continually adding the first and second solutions (e.g., without interruption) to the reactor until the entire amounts of the first and second solutions to be used are in the reactor. Optionally, the first and/or second solutions may be gradually added to the reactor in a non-continual or semi-continuous manner, such as by periodically or irregularly adding the first and/or second solutions to the reactor. For example, a first portion of the first and/or second solutions may be added to the reactor, followed by stopping the addition of the first and/or second solutions to the reactor, followed by adding a different, second portion of the first and/or second solution to the reactor, followed by stopping the addition of the first and/or second solutions to the reactor, and so on, until the entire amounts of the first and second solutions to be used are in the reactor.

In some embodiments, the feed solutions may be added to the reactor during an initial period without discharging the product liquor. In some embodiments, the reactor may be precharged with a material selected from HF, a source of A, preformed particles of the $Mn^{+4}$ doped phosphor or the undoped host, or a combination thereof. A non-solvent or antisolvent for the phosphor product may also be included in the precharge. Suitable materials for the antisolvent include acetone, acetic acid, isopropanol, ethanol, methanol, acetonitrile, dimethyl formamide, or a combination thereof. Alternatively, the antisolvent may be included in any of the feed solutions, or in a separate feed solution without a source of M or Mn, particularly in a feed solution that includes a source of A without a source of M or Mn.

In one embodiment, a process according to the present invention may minimize (or reduce relative to another process, such as a batch process) the amount of raw materials used to prepare the phosphors of formula I. In particular, the amount of toxic materials such as HF used may be significantly reduced in comparison with a batch process. Where the amount of HF is reduced, the product liquor may contain a higher level of raw materials compared to a batch process. In many embodiments, the product liquor contains at least 10% dissolved solids, particularly at least 19% dissolved solids, after the start of the discharge. Additionally, product yields may be higher compared batch processes. For example, product yield from processes according to the present invention may be as high as 85-95%, whereas yields from batch processes are typically in the range of 60%-75%.

After the initial period, at least a portion of the product liquor may be discharged. Addition of the feed solutions may be continued while the product liquor is discharged, although, in some embodiments, it may be desirable to suspend the addition during the discharge period. The length of each addition period before or between discharge events typically ranges between 2 and 30 minutes, particularly between 5-15 minutes, more particularly 8-12 minutes. Longer addition periods may result in larger particles, and/or degradation of the product, resulting in loss of desirable properties such as brightness. The total reaction time, that is, the total length of tall addition periods, is not critical. In some embodiments, it may be about one hour.

The first solution includes aqueous HF and a source of M. The source of M may be a compound containing Si, having good in solubility in the solution, for example, $H_2SiF_6$, $Na_2SiF_6$, $(NH_4)_2SiF_6$, $Rb_2SiF_6$, $Cs_2SiF_6$, $SiO_2$ or a combination thereof, particularly $H_2SiF_6$. Use of $H_2SiF_6$ is advantageous because it has very high solubility in water, and it contains no alkali metal element as an impurity. The source of M may be a single compound or a combination of two or more compounds. The HF concentration in the first solution may be at least 25 wt %, particularly at least 30 wt %, more particularly at least 35 wt %. Water may be added to the first solution, reducing the concentration of HF, to decrease particle size and improve product yield. Concentration of the material used as the source of M may be ≤25 wt %, particularly ≤15 wt %.

The second solution includes a source of Mn, and may also include aqueous HF as a solvent. Suitable materials for use as the source of Mn include for example, $K_2MnF_6$, $KMnO_4$. $K_2MnCl_6$, $MnF_4$, $MnF_3$, $MnF_2$, $MnO_2$, and combinations thereof, and, in particular, $K_2MnF_6$. Concentration of the compound or compounds used as the source of Mn is not critical; and is typically limited by its solubility in the solution. The HF concentration in the second solution may be at least 20 wt %, particularly at least 40 wt %.

The first and second solutions are added to the reactor in the presence of a source of A while stirring the product liquor. Amounts of the raw materials used generally correspond to the desired composition, except that an excess of the source of A may be present. Flow rates may be adjusted so that the sources of M and Mn are added in a roughly stoichiometric ratio while the source of A is in excess of the stoichiometric amount. In many embodiments, the source of A is added in an amount ranging from about 150% to 300% molar excess, particularly from about 175% to 300% molar excess. For example, in Mn-doped $K_2SiF_6$, the stoichiometric amount of K required is 2 moles per mole of Mn-doped $K_2SiF_6$, and the amount of KF or $KHF_2$ used ranges from about 3.5 moles to about 6 moles of the product phosphor.

The source of A may be a single compound or a mixture of two or more compounds. Suitable materials include KF, $KHF_2$, KOH, KCl, KBr, Kl, $KOCH_3$ or $K_2CO_3$, particularly KF and $KHF_2$ more particularly $KHF_2$. A source of Mn that contains K, such as $K_2MnF_6$, may be a K source, particularly in combination with KF or $KHF_2$. The source of A may be present in either or both of the first and second solutions, in a third solution added separately, in the reactor pot, or in a combination of one or more of these.

After the product liquor is discharged from the reactor, the $Mn^{+4}$ doped phosphor may be isolated from the product liquor by simply decanting the solvent or by filtration, and treated as described in U.S. Pat. No. 8,252,613 or US 2015/0054400, with a concentrated solution of a compound of formula II in aqueous hydrofluoric acid;

$$A^1_x[MF_y] \tag{II}$$

wherein $A^1$ is H, Li, Na, K, Rb, Cs, or a combination thereof;

M is Si, Ge, Sn, Ti, Zr, Al, Ga, In, Sc, Y, La, Nb, Ta, Bi, Gd, or a combination thereof;

x is the absolute value of the charge of the [$MF_y$] ion; and y is 5, 6 or 7.

The compound of formula II includes at least the $MF_y$ anion of the host compound for the product phosphor, and may also include the $A^+$ cation of the compound of formula I. For a product phosphor of formula Mn-doped $K_2SiF_6$, suitable materials for the compound of formula II include $H_2SiF_6$, $Na_2SiF_6$, $(NH_4)_2SiF_6$, $Rb_2SiF_6$, $Cs_2SiF_6$, or a combination thereof, particularly $H_2SiF_6$, $K_2SiF_6$ and combinations thereof, more particularly $K_2SiF_6$. The treatment solution is a saturated or nearly saturated of the compound of formula II in hydrofluoric acid. A nearly saturated solution contains about 1-10% excess aqueous HF added to a saturated solution. Concentration of HF in the solution ranges from about 25% (wt/vol) to about 70% (wt/vol), in particular from about 40% (wt/vol) to about 50% (wt/vol). Less concentrated solutions may result in reduced performance of the phosphor. The amount of treatment solution used ranges from about 2-30 ml/g product, particularly about 5-20 ml/g product, more particularly about 5-15 ml/g product.

The treated phosphor may be vacuum filtered, and washed with one or more solvents to remove HF and unreacted raw materials. Suitable materials for the wash solvent include acetic acid and acetone, and combinations thereof.

Span is a measure of the width of the particle size distribution curve for a particulate material or powder, and is defined according to equation (1):

$$\text{Span} = \frac{(D_{90} - D_{10})}{D_{50}} \tag{1}$$

wherein

D$_{50}$ is the median particle size for a volume distribution;

D$_{90}$ is the particle size for a volume distribution that is greater than the particle size of 90% of the particles of the distribution; and D$_{10}$ is the particle size for a volume distribution that is greater than the particle size of 10% of the particles of the distribution.

Particle size of the phosphor powder may be conveniently measured by laser diffraction methods, and software provided with commercial instruments can generate D$_{90}$, D$_{10}$, and D$_{50}$ particle size values and span of the distribution. For phosphor particles of the present invention, D$_{50}$ particle size ranges from about 10 μm to about 40 particularly from about 15 μm to about 35 more particularly from about 20 μm to about 30 Span of the particle size distribution may be ≤1.0, particularly ≤0.9, more particularly ≤0.8, and even more particularly ≤0.7. Particle size may be controlled by adjusting flow rates, reactant concentrations, and equilibrium volume of the product liquor.

After the product phosphor is isolated from the product liquor, treated and dried, it may be annealed to improve stability as described in U.S. Pat. No. 8,906,724. In such embodiments, the product phosphor is held at an elevated temperature, while in contact with an atmosphere containing a fluorine-containing oxidizing agent. The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, $KrF_2$, $XeF_2$, $XeF_4$, $NF_3$, $SiF_4$, $PbF_2$, $ZnF_2$, $SnF_2$, $CdF_2$ or a combination thereof. In particular embodiments, the fluorine-containing oxidizing agent is $F_2$. The amount of oxidizing agent in the atmosphere may be varied to obtain the color stable phosphor, particularly in conjunction with variation of time and temperature. Where the fluorine-containing oxidizing agent is $F_2$, the atmosphere may include at least 0.5% $F_2$, although a lower concentration may be effective in some embodiments. In particular, the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In particular embodiments, the atmosphere is composed of about 20% $F_2$ and about 80% nitrogen.

The temperature at which the phosphor is contacted with the fluorine-containing oxidizing agent is any temperature in the range from about 200° C. to about 700° C., particularly from about 350° C. to about 600° C. during contact, and in some embodiments from about 500° C. to about 600° C. The phosphor is contacted with the oxidizing agent for a period of time sufficient to convert it to a color stable phosphor. Time and temperature are interrelated, and may be adjusted together, for example, increasing time while reducing temperature, or increasing temperature while reducing time. In particular embodiments, the time is at least one hour, particularly for at least four hours, more particularly at least six hours, and most particularly at least eight hours.

After holding at the elevated temperature for the desired period of time, the temperature in the furnace may be reduced at a controlled rate while maintaining the oxidizing atmosphere for an initial cooling period. After the initial cooling period, the cooling rate may be controlled at the same rate or a different rate, or may be uncontrolled. In some embodiments, the cooling rate is controlled at least until a temperature of 200° C. is reached. In other embodiments, the cooling rate is controlled at least until a temperature at which it is safe to purge the atmosphere is reached. For example, the temperature may be reduced to about 50° C. before a purge of the fluorine atmosphere begins. Reducing the temperature at a controlled rate of ≤5° C. per minute may yield a phosphor product having superior properties compared to reducing the temperature at a rate of 10° C./minute. In various embodiments, the rate may be controlled at ≤5° C. per minute, particularly at ≤3° C. per minute, more particularly at a rate of ≤1° C. per minute.

The period of time over which the temperature is reduced at the controlled rate is related to the contact temperature and cooling rate. For example, when the contact temperature is 540° C. and the cooling rate is 10° C./minute, the time period for controlling the cooling rate may be less than one hour, after which the temperature may be allowed to fall to the purge or ambient temperature without external control. When the contact temperature is 540° C. and the cooling rate is ≤5° C. per minute, then the cooling time may be less than two hours. When the contact temperature is 540° C. and the cooling rate is ≤3° C. per minute, then the cooling time may be less than three hours. When the contact temperature is 540° C. and the cooling rate is ≤1° C. per minute, then the cooling time is may be less than four hours. For example, the temperature may be reduced to about 200° C. with controlled cooling, then control may be discontinued. After the controlled cooling period, the temperature may fall at a higher or lower rate than the initial controlled rate.

The manner of contacting the phosphor with the fluorine-containing oxidizing agent is not critical and may be accomplished in any way sufficient to convert the phosphor to a color stable phosphor having the desired properties. In some embodiments, the chamber containing the phosphor may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

The annealed phosphor may be treated with a saturated or nearly saturated solution of a composition of formula II in aqueous hydrofluoric acid, as described in U.S. Pat. No. 8,252,613. The amount of treatment solution used ranges from about 10 ml/g product to 20 ml/g product, particularly about 10 ml/g product. The treated annealed phosphor may be isolated by filtration, washed with solvents such as acetic acid and acetone to remove contaminates and traces of water, and stored under nitrogen.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self-supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0\leq i$; $0\leq j$; $0\leq k$ and $I+j+k=1$) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, phosphor composition 22 is radiationally coupled to the LED chip 12. Radiationally coupled means that the elements are associated with each other so radiation from one is transmitted to the other. Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In some embodiments, the encapsulant material 20 is a silicone matrix having an index of refraction R, and, in addition to phosphor composition 22, contains a diluent material having less than about 5% absorbance and index of refraction of R±0.1. The diluent material has an index of refraction of ≤1.7, particularly ≤1.6, and more particularly ≤1.5. In particular embodiments, the diluent material is of formula II, and has an index of refraction of about 1.4. Adding an optically inactive material to the phosphor/silicone mixture may produce a more gradual distribution of light flux through the phosphor/encapsulant mixture and can result in less damage to the phosphor. Suitable materials for the diluent include fluoride compounds such as LiF, $MgF_2$, $CaF_2$, $SrF_2$, $AlF_3$, $K_2NaAlF_6$, $KMgF_3$, $CaLiAlF_6$, $K_2LiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into silicone encapsulants before silicone curing.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
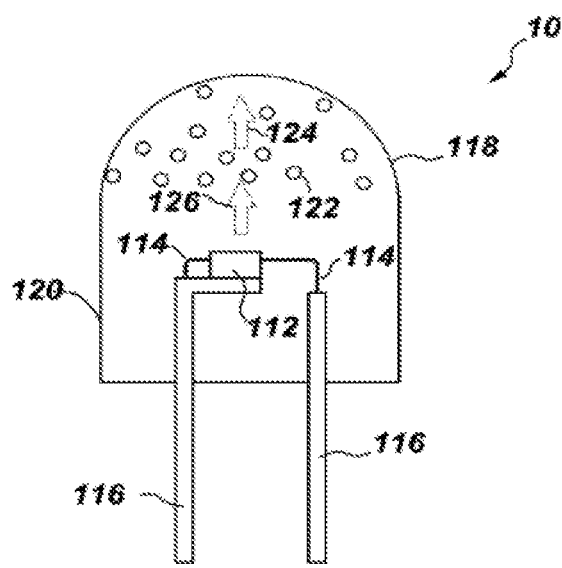
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
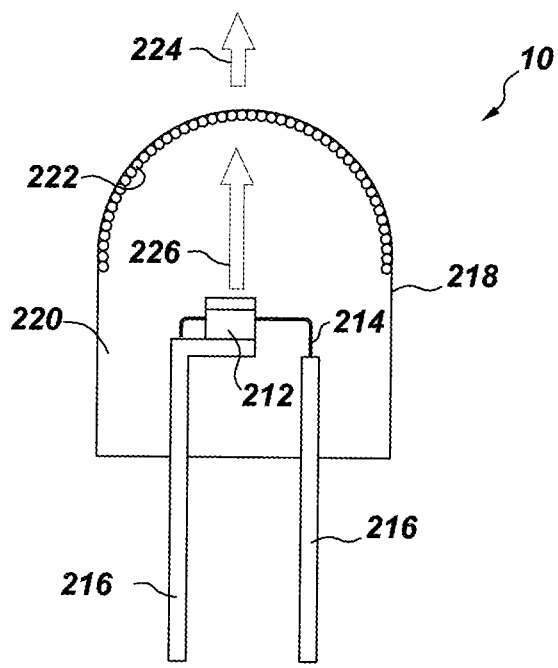
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
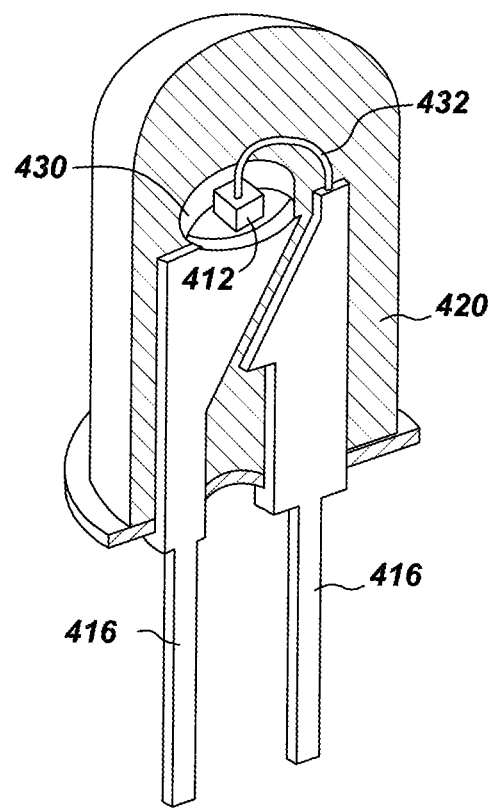
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
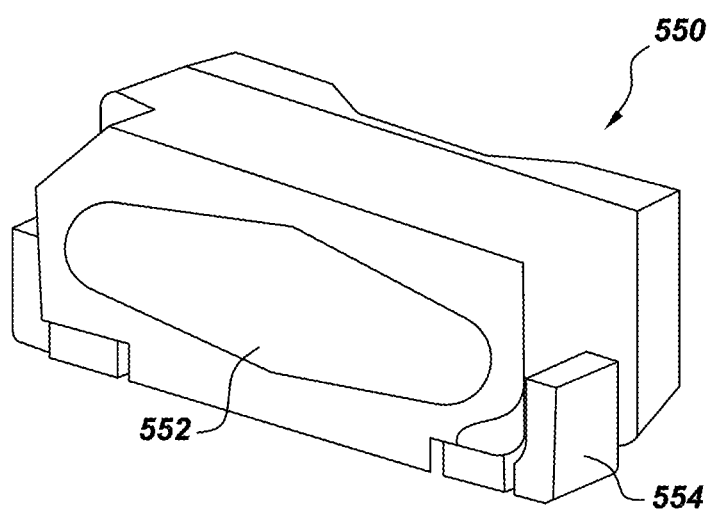
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. Other backlight devices include, but are not limited to, TVs, computers, smartphones, tablet computers and other handheld devices that have a display including a semiconductor light source; and a color stable $Mn^{4+}$ doped phosphor according to the present invention.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the color stable $Mn^{4+}$ doped phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Other materials suitable for use in phosphor composition 22 include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly (vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Suitable phosphors for use in phosphor composition 22 in addition to the $Mn^{4+}$ doped phosphor include, but are not limited to:

$((Sr_{1-z} (Ca, Ba, Mg, Zn)_z)_{1-(x+w)}(Li, Na, K, Rb)_w Ce_x)_3 (Al_{1-y}Si_y)O_{4+y+3(x-w)}F_{1-y-3(x-w)}$, $0<x\leq 0.10$, $0\leq y\leq 0.5$, $0\leq z\leq 0.5$, $0\leq w\leq x$;

$(Ca, Ce)_3Sc_2Si_3O_{12}$ (CaSiG);

$(Sr,Ca,Ba)_3Al_{1-x}Si_xO_{4+x}F_{1-x}:Ce^{3+}$ (SASOF));

$(Ba,Sr,Ca)_5(PO_4)_3(Cl,F,Br,OH):Eu^{2+},Mn^{2+}$; $(Ba,Sr)Ca$ $BPO_5:Eu^{2+},Mn^{2+}$; $(Sr,Ca)_{10}(PO_4)_6*vB_2O_3:Eu^{2+}$ (wherein $0<v\leq 1$); $Sr_2Si_3O_8*2SrCl_2:Eu^{2+}$; $(Ca,Sr,Ba)_3MgSi_2O_8:Eu^{2+}$, $Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$; $ZnS:Cu^+,Cl^-$; $ZnS:Cu^+$, $Al^{3+}$; $ZnS:Ag^+,Cl^-$; $ZnS:Ag^+,Al^{3+}$; $(Ba,Sr,Ca)_2Si_{1-\xi}O_{4-2\xi}$: $Eu^{2+}$ (wherein $0\leq\xi\leq 0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al, Ga)_{5-\alpha}O_{12-3/2\alpha}:Ce^{3+}$ (wherein $0\leq\alpha\leq 0.5$); $(Ca,Sr)_8(Mg,Zn) (SiO_4)_4Cl_2:Eu^{2+},Mn^{2+}$; $Na_2Gd_2B_2O_7:Ce^{3+},Tb^{3+}$; $(Sr,Ca,Ba, Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca, Sr)S:Eu^{2+},Ce^{3+}$; $SrY_2S_4:Eu^{2+}$; $CaLa_2S_4:Ce^{3+}$; $(Ba,Sr, Ca)MgP_2O_7:Eu^{2+},Mn^{2+}$; $(Y,Lu)_2WO_6:Eu^{3+},Mo^{6+}$; $(Ba,Sr, Ca)_\beta Si_\gamma N_\mu:Eu^{2+}$ (wherein $2\beta+4\gamma=3\mu$; $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $-0.5\leq u\leq 1$, $0<v\leq 0.1$, and $0\leq w\leq 0.2$); $(Y,Lu,Gd)_{2-\alpha}$ $Ca_\varphi Si_4N_{6+\varphi}C_{1-\varphi}:Ce^{3+}$, (wherein $0\leq\varphi\leq 0.5$); $(Ca, Sr,Ba) SiO_2N_2:Eu^{2+},Ce^{3+}$;

$(Lu,Ca,Li,Mg,Y)$ $\alpha$-SiAlON doped with $Eu^{2+}$ and/or $Ce^{3+}$; $\beta$-SiAlON:$Eu^{2+}$, $3.5MgO*0.5MgF_2*GeO_2:Mn^{4+}$; $Ca_{1-c-f}Ce_cEu_fAl_{1+c}Si_{1-c}N_3$, (where $0\leq c\leq 0.2$, $0\leq f\leq 0.2$); $Ca_{1-h-r}Ce_hEu_rAl_{1-h}(Mg,Zn)_hSiN_3$, (where $0\leq h\leq 0.2$, $0\leq r\leq 0.2$); $Ca_{1-2s-t}Ce_s(Li,Na)_sEu_tAlSiN_3$, (where $0\leq s\leq 0.2$, $0\leq f\leq 0.2$, s+t>0); and $Ca_{1-\sigma-\chi-\phi}Ce_\sigma(Li,Na)_\chi Eu_\phi Al_{1+\sigma-\chi}Si_{1-\sigma+\chi}N_3$, (where $0\leq\sigma\leq 0.2$, $0\leq\chi\leq 0.4$, $0\leq\phi\leq 0.2$).

In particular, phosphor composition 22 may include one or more phosphors that result in a green spectral power distribution under ultraviolet, violet, or blue excitation. In the context of the present invention, this is referred to as a green phosphor or green phosphor material. The green phosphor may be a single composition or a blend that emits light in a green to yellow-green to yellow range, such as cerium-doped yttrium aluminum garnets, more particularly $(Y,Gd,Lu,Tb)_3(Al,Ga)_5O_{12}:Ce^{3+}$. The green phosphor may also be a blend of blue- and red-shifted garnet materials. For example, a $Ce^{3+}$-doped garnet having blue shifted emission may be used in combination with a $Ce^{3+}$-doped garnet that has red-shifted emission, resulting in a blend having a green spectral power distribution. Blue- and red-shifted garnets are known in the art. In some embodiments, versus a baseline $Y_3Al_5O_{12}:Ce^{3+}$ phosphor, a blue-shifted garnet may have $Lu^{3+}$ substitution for $Y^{3+}$, $Ga^{3+}$ substitution for $Al^{3+}$, or lower $Ce^{3+}$ doping levels in a $Y_3Al_5O_{12}:Ce^{3+}$ phosphor composition. A red-shifted garnet may have $Gd^{3+}/Tb^{3+}$ substitution for $Y^{3+}$ or higher $Ce^{3+}$ doping levels. An example of a green phosphor that is particularly useful for display application is β-SiAlON.

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination. The list of potential phosphor for blending given here is not meant to be exhaustive and these $Mn^{4+}$-doped phosphors can be blended with various phosphors with different emission to achieve desired spectral power distributions.

In some embodiments, lighting apparatus 10 has a color temperature less than or equal to 4200 K, and phosphor composition 22 includes a red phosphor consisting of a color stable $Mn^{4+}$ doped phosphor of formula I. That is, the only red phosphor present in phosphor composition 22 is the color stable $Mn^{4+}$ doped phosphor; in particular, the phosphor is $K_2SiF_6:Mn^{4+}$. The composition may additionally include a green phosphor. The green phosphor may be a $Ce^{3+}$-doped garnet or blend of garnets, particularly a $Ce^{3+}$-doped yttrium aluminum garnet, and more particularly, YAG having the formula $(Y,Gd,Lu,Tb)_3(Al,Ga)_5O_{12}:Ce^{3+}$. When the red phosphor is $K_2SiF_6:Mn^{4+}$, the mass ratio of the red phosphor to the green phosphor material may be less than 3.3, which may be significantly lower than for red phosphors of similar composition, but having lower levels of the Mn dopant.

The color stable $Mn^{4+}$ doped phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

Comparative Examples 1 and 2: Preparation of $Mn^{4+}$ Doped $K_2SiF_6$ by Batch Process Amounts and distribution of starting materials among Beakers A-D are shown in Table 1. Beaker A was stirred aggressively, and the contents of beaker B were added thereto dropwise over the course of about ten minutes. Dropwise addition of the contents of beaker C and D to beaker A was started about one minute after the contents of beaker B was started and continued over the course of about nine minutes. The precipitate was digested for 10 minutes and the stirring was stopped. The supernatant was decanted, and the precipitate was vacuum filtered, rinsed once with acetic acid and twice with acetone, and then dried under vacuum. The dried powder was sifted through a 325 mesh screen, and annealed under a 20% $F_2$/80% nitrogen atmosphere for 8 hour at 540° C. The annealed phosphor was washed with a solution of 49% HF saturated with $K_2SiF_6$, dried under vacuum and sifted through a 325 mesh screen.

TABLE 1

| | Batch Process Raw Materials | | | | | | | | |
|---|---|---|---|---|---|---|---|---|---|
| | Solution A | | | | Solution B | | Solution C | | Solution D |
| Comp. Ex. no. | KF (g) | $KH_2F$ (g) | $K_2MnF_6$ (g) | HF (49%) (mL) | $H_2SiF_6$ (35%) (mL) | HF (49%) (mL) | $K_2MnF_6$ (g) | HF (49%) (mL) | KF (g) | HF (49%) (mL) |
| 1 | | 6.6 | 0.44 | 120.0 | 35.0 | 122.5 | 1.00 | 35.0 | 22.5 | 42.5 |
| 2 | | 6.6 | 0.75 | 120.0 | 35.0 | 70.0 | 1.61 | 40.0 | 22.5 | 42.5 |

Example 1: Preparation of $Mn^{4+}$ Doped $K_2SiF_6$—0.75% Mn—by Semi-Continuous Flow Process Procedure The reactor is initially charged with a solution of KF or potassium bifluoride in HF. The initial charge may also include $K_2MnF_6$. Then separate feed solutions of $K_2SiF_6$ and $K_2MnF_6$, each in HF are started. A KF or potassium bifluoride solution in HF may be fed separately, although the KF may be included with the other solutions or in the initial charge. After a period of about ten minutes, the feeds are stopped, and part of the mixture is removed from the reactor. This procedure may be repeated multiple times.

Detailed Procedure

1. Use a 1.0 L PTFE reactor and U-shaped impeller.
2. Reactor lid should have three holes drilled for the three feed tubes and a slot to allow the impeller to be centered in the reactor.
3. Prepare 3 clean and dry 500 mL Nalgene bottles with mark at appropriate fill volumes. One bottle will be marked at the sum of the feeds for the first reaction. The other two will be the sum of the feeds for the second, third, and further reactions. (When the reactor is drained after each batch 120 mL of solution will remain in reactor)

4. Prepare feeds according to table below.

| Feed | Conc/Desc. | Volume Required |
|---|---|---|
| $K_2MnF_6$ | 1.96 g/40 mL HF | 410 mL |
| $H_2SiF_6$ | 1 mL/2 mL HF | 945 mL |
| KF | 100 g/150 mL HF | 342.5 mL |

Prime all pumps and insert tubing into reactor lid.

| | Pump Speeds | | | |
|---|---|---|---|---|
| Run | KF | $H_2SiF_6$ | $K_2MnF_6$ | Drain Amount |
| 1 | 5 | 24.7(40 s)/12.7 | 4.7 | 218 mL |
| 2 | | 13.5 | 5.7 | 290 mL |
| 3 | | | | 293 mL |
| 4 | | | 5.9 | |
| 5 | | | | |
| 6 | | | 6.1 | 295 mL |

5. For first run, charge reactor with $KHF_2$ (120 mL) and 0.84 g Mn. With stirrer on at 250 RPM, start pumping only Si feed at 24.7 mL/min. After 40 s, change to 12.7 mL/min. At 1 min, start KF and Mn feeds. Run with all feeds until 9 min 30 s. Stop Mn and KF at 9 min 30 s. At 10 min stop Si feed.

6. When all feeds are stopped, drain reactor in to Nalgene bottle so that only 120 mL remains in reactor (drain 218 mL). Cap bottle and set aside.

7. Change speeds on Si and Mn feeds for second reaction. Start all feeds and run for 12 min. After ten minutes repeat draining procedure (drain 290 mL). Set aside and repeat for batch three and four.

8. While batch four is running, begin filtration by decanting and pouring PFS into filter. Filter all three batches together. Rinse until pH reads 5.5 and set aside to dry and sift.

9. Drain batch four, using one of the bottles from batch 2 or 3, set aside and run and drain batch 5 using the other bottle. While sixth batch is running, filter batches four and five together. Wash and set aside.

10. After pumps are stopped for sixth batch, prepare funnel and completely drain reactor. Rinse as with others.

11. Sift all powders through 325 mesh screen.

Examples 2-3: Preparation of $Mn^{4+}$ Doped $K_2SiF_6$—0.75% and 1.35% Mn—by Semi-Continuous Flow Process The procedure of Example 1 was repeated for Examples 2 and 3. The same amounts of raw materials were used for Example 2; for example 3, the amount of Mn was increased proportionately to achieve about 1.35% Mn in the phosphor product. Results, including particle size distribution data for the resulting phosphors are shown in Table 2.

TABLE 2

| Example no. | Mn % | Total yield (gm) | Yield (gm/min) | PFS passing 325-mesh sieve (gm) | Oversize PFS (gram) | Particle Size | | | |
|---|---|---|---|---|---|---|---|---|---|
| | | | | | | d10 | d50 | d90 | span |
| Comparative Example 1 | ~0.75% | 27.6 | 2.76 | 24.2 | 3.4 | 15.6 | 27.3 | 44.7 | 1.07 |
| Comparative Example 2 | ~1.35% | 30.6 | 3.06 | 26.7 | 3.9 | 18.9 | 27.8 | 39.8 | 0.75 |
| Example 1 | ~0.75% | 239.6 | 6.7 | 237 | 2.6 | 16.2 | 26.7 | 41.6 | 0.95 |
| Example 2 | ~0.75% | 233.5 | 6.5 | 230 | 3.5 | 15.4 | 26.5 | 43.2 | 1.05 |
| Example 3 | ~1.35% | 221.4 | 6.2 | 219.3 | 2.1 | 18.1 | 26.9 | 39.1 | 0.78 |

For Comparative Examples 1 and 2, it can be seen that the amount of material having particles that were larger than the openings in the 325 sieve was relatively large. In contrast, for the phosphors of Examples 1-3, the amount of oversize particles was greatly reduced).

Comparative Examples 4 Through 7: Synthesis in Acidic Environments

As described above, in one or more embodiments, the first solution that contains aqueous HF and the source of M and the second solution that contains the source of Mn can be gradually added to a reactor in the presence of the source of A and an anion selected from phosphate, sulfate, acetate, and combinations thereof, to form the product liquor comprising the $Mn^{4+}$ doped phosphor of formula I, and periodically discharging the product liquor from the reactor. The first solution and the second solution can be added to the reactor in the presence of the source of A and the anion and, optionally, a cation selected from H, Li, Na, K, Rb, Cs, or a combination thereof. The first and/or second solution can include the $H^+$ and $A^+$ cations. The anion and/or cation may be obtained from an acid and/or an acetate, such as sulfuric acid, phosphoric acid, hydrochloric acid, nitric acid, hydrobromic acid, hydriodic acid, or perchloric acid; or from potassium sulfate, a potassium acetate, or another potassium source.

Adding the anion and/or cation described above can produce LEDs having narrow red phosphor with better QE before any post synthesis treatments. The presence of a relatively small amount of acid during the chemical synthesis can maintain the desirable acidity environment for the formation of red phosphor crystals. The acidity environment also minimizes or reduces defects within the synthesized phosphor crystal (relative to a synthesis process that does not have such an acidic environment). The fewer defects can lead to greater quantum efficiencies.

Example 4: Control Sample 125 g of KHF$_2$ was dissolved in 230 mL of 49% HF in a first beaker. Ten grams of K$_2$MnF$_6$ was dissolved in 200 mL 49% HF in a second beaker. 81 mL of 35% H$_2$SiF was mixed with 174 mL of 49% HF in a third beaker. The contents of the first, second, and third beakers were combined in a reaction vessel and stirred. The precipitate was then allowed to settle, the supernatant was decanted, and 600 mL of a saturated solution of K$_2$SiF$_6$ in 49% HF was added to the reaction vessel and stirred for 20 minutes. The stirring was stopped, the supernatant decanted, and the precipitate was vacuum filtered and dried under vacuum. The dried precipitate was then annealed under 20% F$_2$/80% N$_2$ at 540° C. for 8 hours, and stirred in 900 mL of a saturated solution of K$_2$SiF$_6$ in 49% HF for 30 minutes. The stirring was stopped, the supernatant was decanted, and the precipitate was vacuum filtered and dried under vacuum. The resulting dried phosphor was sifted through 270 mesh screen and the QE was measured.

Example 5: H$_2$SO$_4$ Addition 125 g of KHF$_2$ was dissolved in 230 mL of 49% HF in a fourth beaker. 10 g of K$_2$MnF$_6$ was dissolved in 200 mL of 49% HF in a fifth beaker. 81 mL of 35% H$_2$SiF$_6$ was mixed with 174 mL of 49% HF and 10.2 mL of 18M H$_2$SO$_4$ in a sixth beaker. The contents of the fourth, fifth, and sixth beakers were combined in a reaction vessel and stirred. The precipitate was then allowed to settle, the supernatant was decanted, and 600 mL of a saturated solution of K$_2$SiF$_6$ in 49% HF was added to the reaction vessel and stirred for 20 minutes. The stirring was stopped, the supernatant decanted, and the precipitate was vacuum filtered and dried under vacuum. The dried precipitate was then annealed under 20% F$_2$/80% N$_2$ at 540° C. for 8 hours, and stirred in 900 mL of a saturated solution of K$_2$SiF$_6$ in 49% HF for 30 minutes. The stirring was stopped, the supernatant decanted, and the precipitate was vacuum filtered and dried under vacuum. The resulting dried phosphor was sifted through 270 mesh screen and the QE was measured.

Example 6: K$_2$SO$_4$ Addition 118 g of KHF$_2$ and 11.4 g K$_2$SO$_4$ was dissolved in 230 mL 49% HF in a seventh beaker. 10 g of K$_2$MnF$_6$ was dissolved in 200 mL of 49% HF in an eighth beaker. 81 mL of 35% H$_2$SiF$_6$ was mixed with 174 mL of 49% HF in a ninth beaker. The contents of the seventh, eighth, and ninth beakers were combined in a reaction vessel and stirred. The precipitate was then allowed to settle, the supernatant was decanted, and 600 mL of a saturated solution of K$_2$SiF$_6$ in 49% HF was added to the reaction vessel and stirred for 20 minutes. The stirring was stopped, the supernatant decanted, and the precipitate was vacuum filtered and dried under vacuum. The dried precipitate was then annealed under 20% F$_2$/80% N$_2$ at 540° C. for 8 hours, and stirred in 900 mL of a saturated solution of K$_2$SiF$_6$ in 49% HF for 30 minutes. The stirring was stopped, the supernatant decanted, and the precipitate was vacuum filtered and dried under vacuum. The resulting dried phosphor was sifted through 270 mesh screen and the QE was measured.

Example 7: KC$_2$H$_3$O$_2$ Addition 118 g of KHF$_2$ and 7 g of KC$_2$H$_3$O$_2$ was dissolved in 230 mL 49% HF in a tenth beaker. 10 g of K$_2$MnF$_6$ was dissolved in 200 mL of 49% HF in an eleventh beaker. 81 mL of 35% H$_2$SiF$_6$ was mixed with 174 mL of 49% HF in a twelfth beaker. The contents of the tenth, eleventh, and twelfth beakers were combined in a reaction vessel and stirred. The precipitate was then allowed to settle, the supernatant was decanted, and 600 mL of a saturated solution of K$_2$SiF$_6$ in 49% HF was added to the reaction vessel and stirred for 20 minutes. The stirring was stopped, the supernatant decanted, and the precipitate was vacuum filtered and dried under vacuum. The dried precipitate was then annealed under 20% F$_2$/80% N$_2$ at 540° C. for 8 hours, and stirred in 900 mL of a saturated solution of K$_2$SiF$_6$ in 49% HF for 30 minutes. The stirring was stopped, the supernatant decanted, and the precipitate was vacuum filtered and dried under vacuum. The resulting dried phosphor was sifted through 270 mesh screen and the QE was measured.

Table 3 below illustrates the amounts of KHF$_2$, HF, MnF$_6$, H$_2$SiF$_6$, and additional reactants (where applicable) used to create the dried phosphors for each of the preceding Examples 4 through 7, as well as the measured QE of the dried phosphors. The measured QE for the samples listed in Table 3 are normalized to the QE of the control sample (e.g., Example 4).

TABLE 3

| Sample | g KHF$_2$/ mL HF | g K$_2$MnF$_6$/ mL HF | mL H$_2$SiF$_6$/ mL HF | Additional reactant | QE |
|---|---|---|---|---|---|
| Example 4 (control) | 125/230 | 10/200 | 81/174 | none | 100 |
| Example 5 | 125/230 | 10/200 | 81/174 | 10.2 mL H$_2$SO$_4$ | 102.1 |
| Example 6 | 118/230 | 10/200 | 81/174 | 11.4 g K$_2$SO$_4$ | 102.3 |
| Example 7 | 118/230 | 10/200 | 81/174 | 7 g KC$_2$H$_3$O$_2$ | 103.7 |

As shown in Table 3, the addition of one or more anions and/or cations from an acid to the solutions used to form the phosphor during the chemical synthesis of the phosphor can increase the QE of the resultant phosphor. While some additives are shown in Table 3, the list of additives that may be used to increase the QE of the phosphor may include acids, acetates, or other substances other than those listed in Table 3.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A process for preparing a Mn$^{+4}$ doped phosphor of formula I

$$A_x[MF_y]: Mn^{+4} \qquad I$$

the process comprising gradually adding a first solution comprising a source of M and HF and a second solution comprising a source of Mn to a reactor, in the presence of a source of A and an anion selected from phosphate, sulfate, acetate, and combinations thereof, to form a product liquor comprising the Mn+4 doped phosphor; and gradually discharging the product liquor from the reactor while volume of the product liquor in the reactor remains approximately constant;

wherein

A is Li, Na, K, Rb, Cs, or a combination thereof;

M is Si, Ge, Sn, Ti, Zr, Al, Ga, In, Sc, Y, La, Nb, Ta, Bi, Gd, or a combination thereof;

x is the absolute value of the charge of the $[MF_y]$ ion; and y is 5, 6 or 7.

2. The process according to claim 1, wherein gradually adding the first solution and the second solution in the presence of the source of A and the anion includes adding the first solution and the second solution in the presence of the source of A and potassium sulfate, potassium acetate, or a combination thereof.

3. The process according to claim 1, wherein gradually adding the first solution and the second solution to the reactor in the presence of the source of A and the anion includes continually adding the first solution and the second solution to the reactor in the presence of the source of A and the anion.

4. The process according to claim 1, wherein gradually adding the first solution and the second solution to the reactor in the presence of the source of A and the anion includes semi-continually adding the first solution and the second solution to the reactor in the presence of the source of A and the anion.

5. The process according to claim 1, further comprising an initial period wherein the first and second solutions are gradually added to the reactor without discharging the product liquor.

6. The process according to claim 1, additionally comprising precharging the reactor with a material selected from HF, the source of A, preformed particles of the $Mn^{+4}$ doped phosphor, or a combination thereof.

7. The process according to claim 1, wherein:

A is Na, K, Rb, Cs, or a combination thereof;

M is Si, Ge, Ti, or a combination thereof; and

Y is 6.

8. The process according to claim 1, wherein the $Mn^{+4}$ doped phosphor of formula I is $K_2SiF_6: Mn^{4+}$.

9. A $Mn^{+4}$ doped phosphor of formula I prepared by a process according to claim 1.

10. A lighting apparatus comprising a $Mn^{+4}$ doped phosphor according to claim 9.

11. A backlight device comprising a $Mn^{+4}$ doped phosphor according to claim 9.

12. A process for preparing a $Mn^{+4}$ doped phosphor of formula I $$A_x[MF_y]: Mn^{+4} \quad \text{I}$$

the process comprising gradually adding a first solution comprising a source of M and HF and a second solution comprising a source of Mn to a reactor, in the presence of a source of A and a source of an anion selected from phosphate, sulfate, acetate, and combinations thereof, to form a product liquor comprising the $Mn^{+4}$ doped phosphor, wherein the source of the anion is an acid, an acetate, or a combination thereof; and gradually discharging the product liquor from the reactor while volume of the product liquor in the reactor remains approximately constant;

wherein

A is Li, Na, K, Rb, Cs, or a combination thereof;

M is Si, Ge, Sn, Ti, Zr, Al, Ga, In, Sc, Y, La, Nb, Ta, Bi, Gd, or a combination thereof x is the absolute value of the charge of the $[MF_y]$ ion; and y is 5, 6 or 7.

13. The process according to claim 12, wherein the source of the anion is sulfuric acid, phosphoric acid, or a combination thereof.

14. The process according to claim 12, wherein the source of the anion is potassium sulfate, potassium acetate, or a combination thereof.

15. The process according to claim 12, wherein gradually adding the first solution and the second solution to the reactor in the presence of the source of A and the anion includes continually adding the first solution and the second solution to the reactor in the presence of the source of A and the source of the anion.

16. The process according to claim 12, wherein gradually adding the first solution and the second solution to the reactor in the presence of the source of A and the anion includes semi-continually adding the first solution and the second solution to the reactor in the presence of the source of A and the source of the anion.

17. The process according to claim 12, wherein:

A is Na, K, Rb, Cs, or a combination thereof;

M is Si, Ge, Ti, or a combination thereof; and

Y is 6.

18. The process according to claim 12, wherein the $Mn^{+4}$ doped phosphor of formula I is $K_2SiF_6: Mn^{4+}$.

* * * * *